United States Patent [19]
Kojima et al.

[11] Patent Number: 5,486,656
[45] Date of Patent: Jan. 23, 1996

[54] PRINTED CIRCUIT BOARD HAVING AN EXTRA PLATE CONNECTED TO A PRODUCT PORTION

[75] Inventors: Tatsuru Kojima, Tokyo; Naoyuki Kohyama, Saitama, both of Japan

[73] Assignee: NEC Corporation, Tokyo, Japan

[21] Appl. No.: 357,076

[22] Filed: Dec. 15, 1994

Related U.S. Application Data

[63] Continuation of Ser. No. 860,320, Mar. 30, 1992, abandoned.

[30] Foreign Application Priority Data

Mar. 29, 1991 [JP] Japan .................. 3-027039 U

[51] Int. Cl.⁶ ........................................... H01R 9/09
[52] U.S. Cl. ................. 174/261; 361/777; 174/257
[58] Field of Search ......................... 333/17.3, 32, 124, 333/128, 204, 238, 246–247; 361/792, 749, 751, 777–780; 174/250, 257, 260–263

[56] References Cited

U.S. PATENT DOCUMENTS

| | | | |
|---|---|---|---|
| 3,213,325 | 10/1965 | Lindstrand | 361/404 |
| 4,730,238 | 3/1988 | Cook | 361/414 |
| 4,793,058 | 12/1988 | Venaleck | 361/414 X |
| 5,177,069 | 5/1992 | Higgins | 361/792 X |

FOREIGN PATENT DOCUMENTS

| | | |
|---|---|---|
| 2136138 | 9/1984 | United Kingdom . |
| 2143954 | 2/1985 | United Kingdom . |

*Primary Examiner*—Bot L. Ledynh
*Attorney, Agent, or Firm*—Sughrue, Mion, Zinn, Macpeak & Seas

[57] ABSTRACT

A printed circuit board allowing the characteristic impedance and wavelength compaction ratio of microstrip lines thereof measured without disconnecting them from surrounding circuitry. A strip conductor has a land for measurement at one end thereof and chip lands connectable to a chip resistor at the other end.

3 Claims, 5 Drawing Sheets

PRINTED CIRCUIT BOARD HAVING AN EXTRA PLATE CONNECTED TO A PRODUCT PORTION

This is a continuation of application No. 07/860,320 filed Mar. 30, 1992, now abandoned.

BACKGROUND OF THE INVENTION

The present invention relates to a printed circuit board applicable to various kinds of electronic equipment and, more particularly, to a printed circuit board which allows the characteristic impedance and wavelength reduction ratio of microstrip lines thereof to be measured with ease.

It is a common practice with a printed circuit board to form a strip conductor on one surface of a dielectric substrate and a ground conductor on the other surface, thereby providing a microstrip line with a particular characteristic impedance and a particular wavelength compaction ratio. To measure the characteristic impedance and wavelength compaction ratio of microstrip lines included in a wiring pattern, a desired one of the microstrip lines is electrically disconnected from the surrounding circuitry, and then the characteristic impedance and phase rotation angle are measured by a network analyzer or similar implement. The problem with such a conventional procedure is that neither the characteristic impedance nor the wavelength compaction ratio can be seen unless the microstrip line is disconnected from the surrounding circuit pattern. Specifically, changes in the characteristic impedance and wavelength compaction ratio cannot be readily observed in the event of the revision or modification of printed circuit boards, the change of production lot, the manufacturer's changes, etc. Moreover, the conventional procedure is difficult to practice with a multilayer printed circuit board having a strip conductor on the inner layer thereof.

SUMMARY OF THE INVENTION

It is therefore an object of the present invention to provide a printed circuit board which allows the characteristic impedance and wavelength compaction ratio of a microstrip line to be readily measured without disconnecting it from the surrounding circuit pattern.

A printed circuit board having a product portion with or without an extra plate connected to the product portion of the present invention comprises a strip conductor provided on one surface of the printed circuit board, a ground conductor provided on the other surface of the printed circuit board, a land for measurement formed at one end of the strip conductor, and chip lands formed at the other end of the strip conductor and connectable to a chip resistor.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
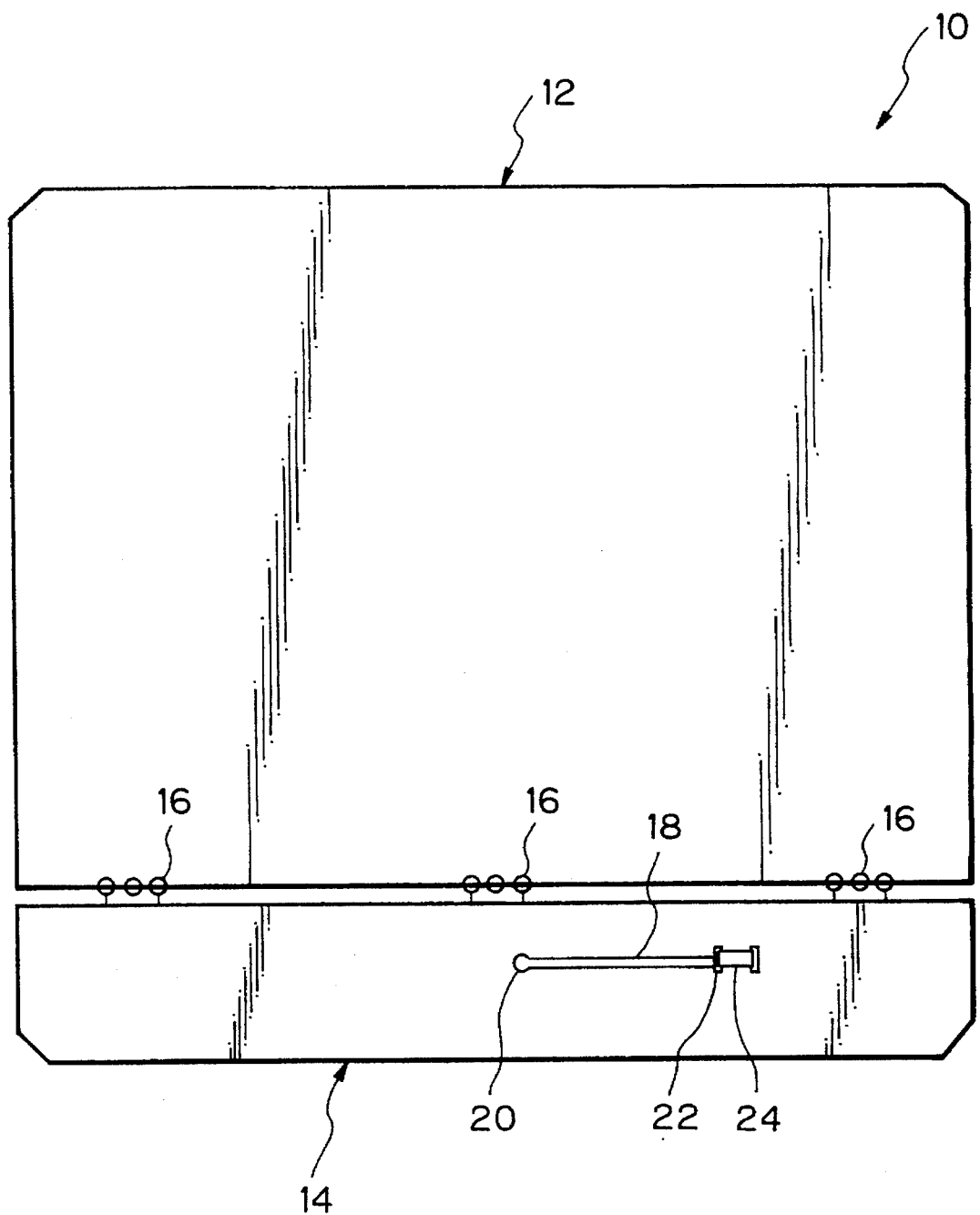
FIG. 1 shows a printed circuit board embodying the present invention.

Referring to FIG. 1 of the drawings, a printed circuit board embodying the present invention is shown and generally designated by the reference numeral 10. As shown, the circuit board 10 is generally made up of a product portion 12 including a circuit pattern, an extra plate portion 14, and a connecting portion 16 for connecting the two portions 12 and 14. A strip conductor 18 is located in the extra plate portion 14 for implementing a microstrip line having the same characteristic impedance $Z_0$ ($\Omega$) and wavelength compaction ratio as microstrip lines arranged in the product portion 12. The strip conductor 18 has at one end thereof a land 20 for measurement and at the other end chip lands 22 to which a chip resistor 24 is connectable.

Figure 2:
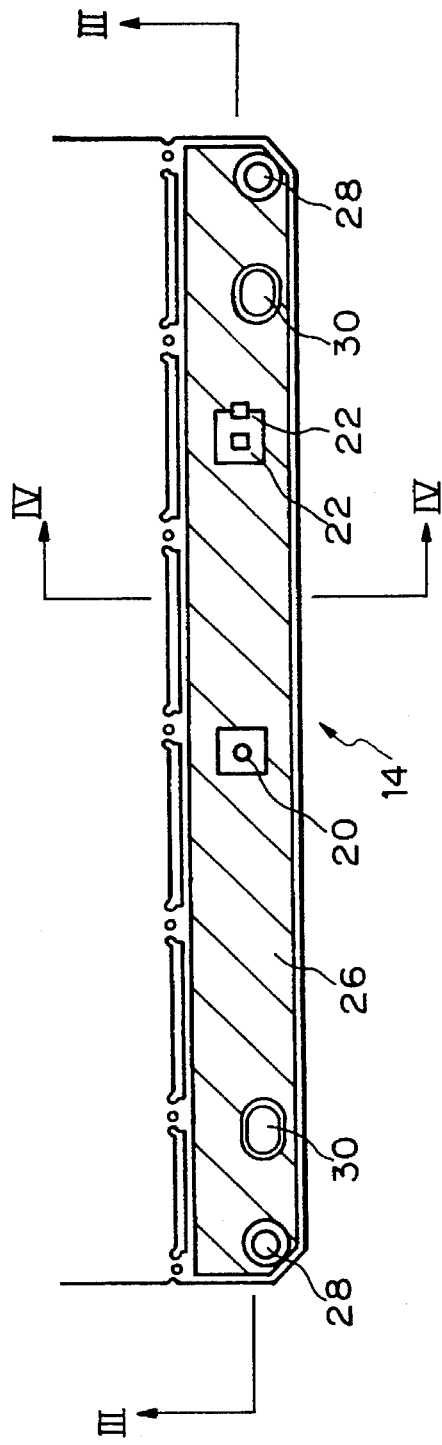
FIG. 2 shows an extra plate portion included in the embodiment in detail; 10
Figure 3:
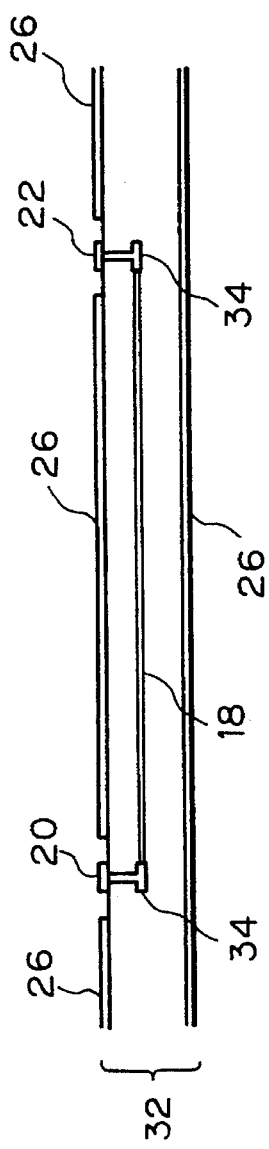
FIG. 3 is a section along line III—III of FIG. 2.
Figure 4:
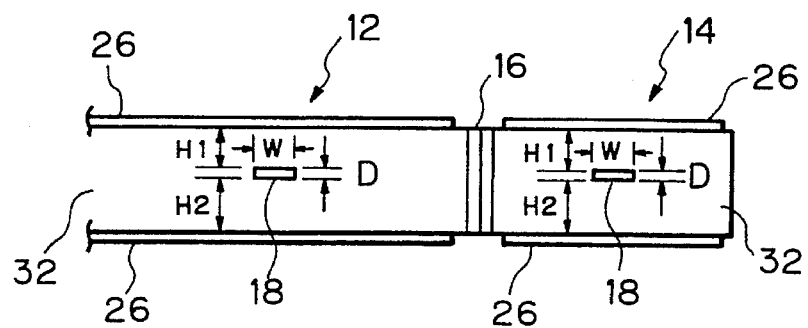
FIG. 4 is a section along line IV—IV of FIG. 2.
Figure 5:
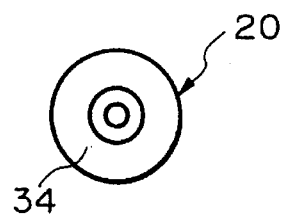
FIGS. 5 and 6 show respectively a land for measurement and chip lands also included in the embodiment in detail.
Figure 6:
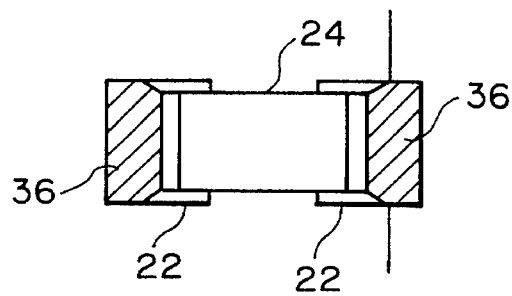
Figure 6:
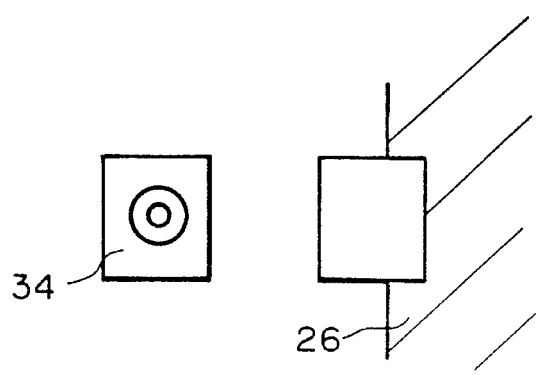

As shown in FIG. 2 specifically, the extra plate portion 14 has a copper foil 26, reference holes 28 for mounting, and auxiliary reference holes 30 for mounting. The land 20 for measurement and the chip lands 22 have their resist removed, so that they may be soldered. FIG. 3 is a section along line III—III of FIG. 2. In FIG. 3, the reference numerals 32 and 34 designate respectively a dielectric portion and vias (blind vias). FIG. 4 is a section along line IV—IV of FIG. 2 and shows the extra plate portion 14 together with part of the product portion 12. As shown, the strip conductors 18 disposed in the product portion 12 and extra plate portion 14 have the same width W and the same thickness D, and the strip conductors 18 and copper foil portions 26 are spaced apart by the same distances $H_1$ and $H_2$. FIGS. 5 and 6 show respectively the land 20 for measurement and the chip lands 22 in detail. In FIG. 6, the reference numeral 36 designates portions to be soldered.

Figure 7A:
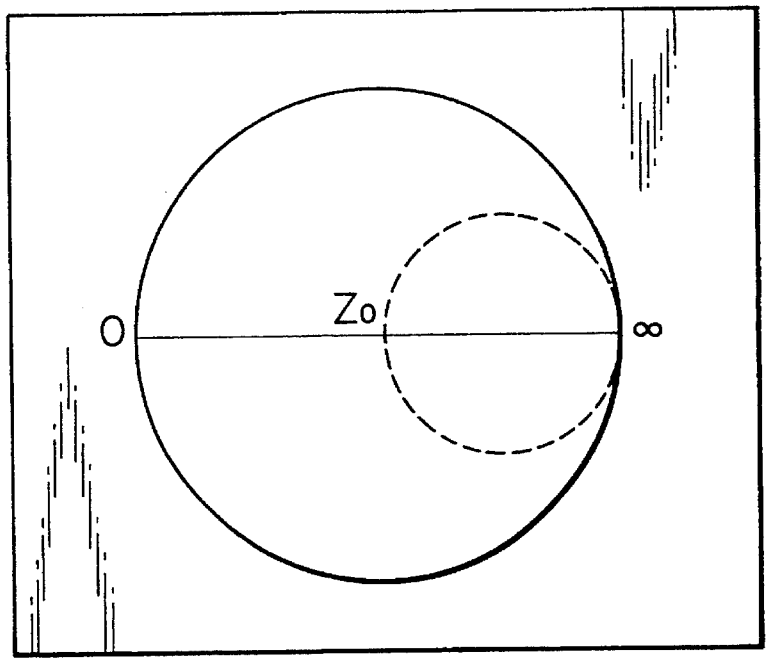
FIGS. 7A, 7B, 8A and 8B each shows a Smith chart associated with a particular impedance condition.
Figure 7B:
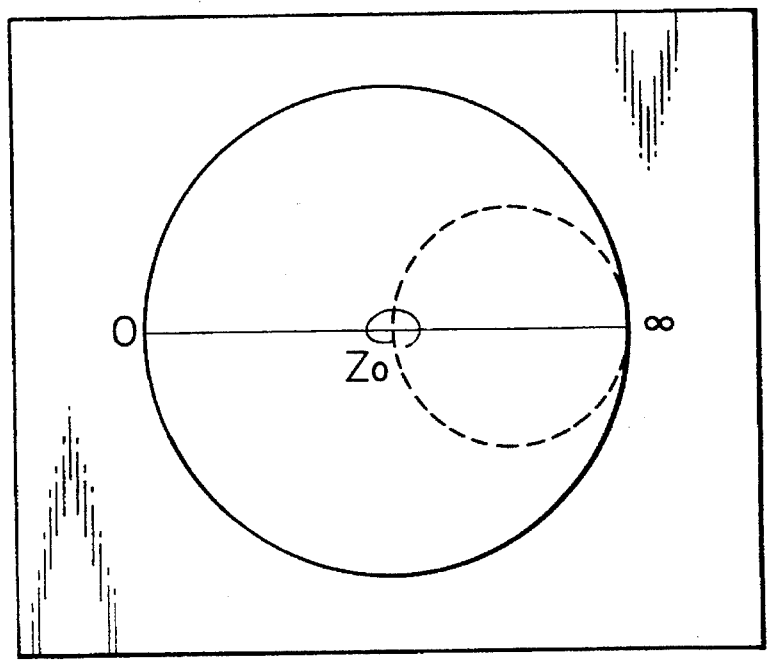
Figure 8A:
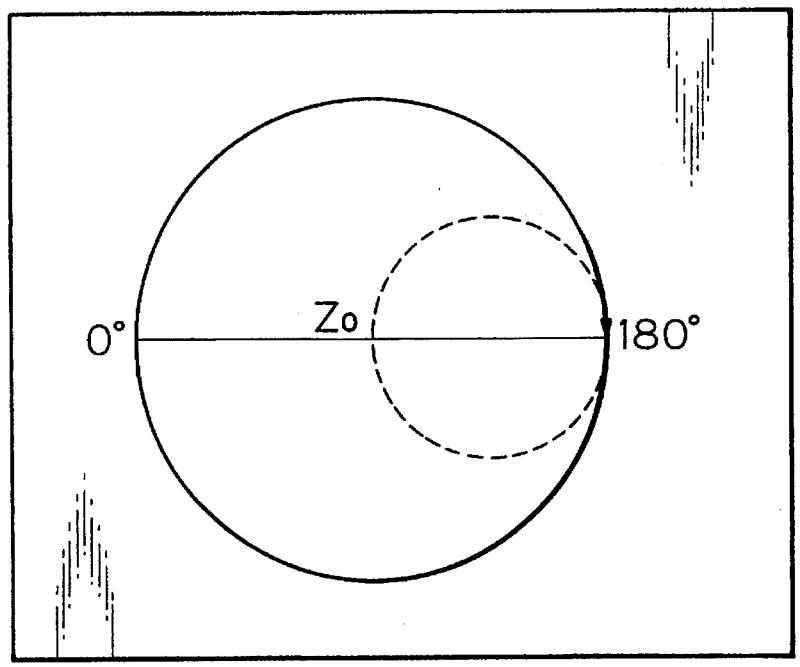
Figure 8B:
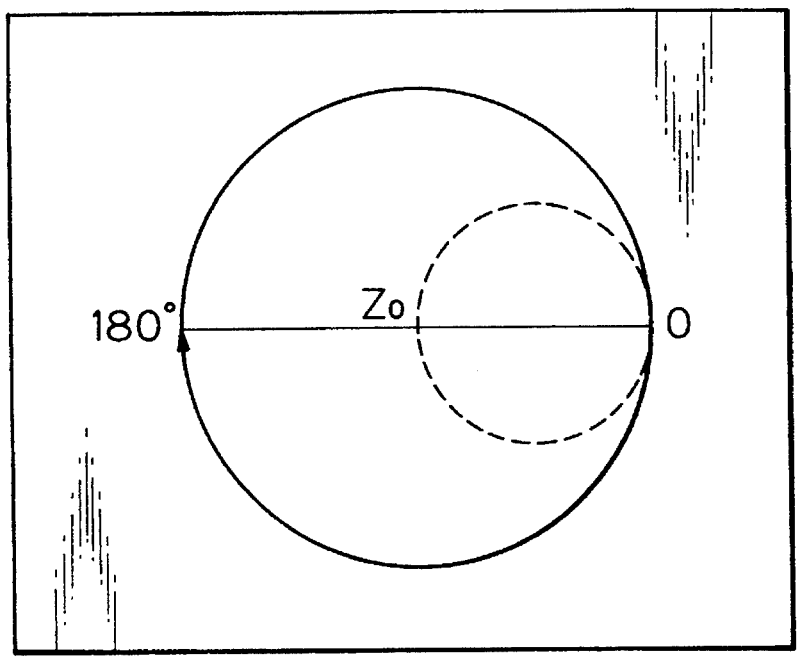

To measure the characteristic impedance $Z_0$ ($\Omega$) of microstrip lines, the resistance of the chip resistor 24 is set to $Z_0$ ($\Omega$). To measure the wavelength reduction ratio $\rho$, the resistance of the chip resistor 24 is set to zero ($\Omega$), or the terminals of the chip lands 22 are brought to an open state. The strip conductor 18 is provided with a ¼ wavelength beforehand which implements a particular phase rotation angle of 180 degrees under a compaction ratio of $\rho_0$. Assume that the chip resistor 24 having the resistance $Z_0$ ($\Omega$) is connected to the chip lands 22, and the measurement terminal of a network analyzer is connected between the land 20 and the ground conductor. Then, the impedance, looking into the chip lands 22 from the land 20, is $Z_0$, as represented by a Smith chart in FIG. 7A. When resistance of the chip register 24 is substantially Zo ($\Omega$), the impedance measured by the network analyzer appears as shown in FIG. 7B. Further, assume that the chip resistor 24 is provided with the resistance of 0 ($\Omega$) and connected to the chip lands 22, and the measurement terminal of the network analyzer is connected to between the land 20 and the ground conductor. Then, the impedance is measured as indicated by a Smith chart in FIG. 8A. When the terminals of the chip lands 22 are open, a Smith chart shown in FIG. 8B is obtained. The phase rotation angle is greater than 180 degrees when the compaction ratio is greater than $\rho_0$ or is smaller than 180 degrees when the compaction ratio is smaller than $\rho_0$.

While the printed circuit board 10 is shown as having both the product portion 12 and the extra plate portion 14, it may have the product portion 12 only. The ¼ wavelength given to the strip conductor 18 is only illustrative and may be replaced with any other suitable wavelength. Although the strip conductor 18 is provided on the surface of the printed circuit board 10, it may be arranged on the inner layer of a multi-layer substrate. Further, the strip conductor 18 may be disposed in the product portion 12 in place of the extra plate portion 14.

In summary, it will be seen that the present invention provides a printed circuit board in which a strip conductor has a land for measurement at one end thereof and chip lands connectable to a chip resistor at the other end. Hence, how the characteristic impedance and wavelength compaction ratio of microstrip lines change can be readily measured in the event of the revision or modification of printed circuit boards, the change of production lot, the manufacturer's change, etc. This is especially true with a multi-layer printed circuit board having a strip conductor on the inner layer thereof.

Various modifications will become possible for those skilled in the art after receiving the teachings of the present disclosure without departing from the scope thereof.

What is claimed is:

1. A laminated printed circuit board having a product portion, including a first strip conductor having a characteristic impedance and wavelength compaction ratio, and an extra plate portion connected to said product portion, said extra plate portion comprising:

a second strip conductor, provided on one of a surface and an inner layer of said laminated printed circuit board, having a characteristic impedance and wavelength compaction ratio which are substantially equal to said characteristic impedance and said wavelength compaction ratio of said first strip conductor of said product portion;

a ground conductor provided on a surface of said laminated printed circuit board;

a land for measurement formed at one end of said second strip conductor;

chip lands formed at the other end of said second strip conductor and connectable to a chip resistor;

wherein one of said chip lands is connected to said second strip conductor and another chip land is connected to said ground conductor; and a connecting portion for connecting said extra plate portion to said product portion, wherein changes in said characteristic impedance and said wavelength compaction ratio of said product portion resulting from modifications to said laminated printed circuit board are measured via said second strip conductor without disconnecting said first strip conductor from surrounding circuitry of said product portion.

2. The laminated printed circuit board as claimed in claim 1, wherein said first strip conductor and said second strip conductor have equal widths and thicknesses.

3. The laminated printed circuit board as claimed in claim 2, wherein said first strip conductor is separated from a ground conductor of said product portion by a predetermined distance; and wherein said second strip conductor is separated from said ground conductor of said extra plate portion by said predetermined distance.

* * * * *